(12) United States Patent
Selvidge et al.

(10) Patent No.: US 8,235,339 B2
(45) Date of Patent: Aug. 7, 2012

(54) METHOD AND APPARATUS FOR ENGAGING A RAIL WITH VARIOUS SUPPORT STRUCTURES

(75) Inventors: David A. Selvidge, Cypress, TX (US);
Paul E. Westphall, Tomball, TX (US);
Kelly K. Smith, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 328 days.

(21) Appl. No.: 12/492,573

(22) Filed: Jun. 26, 2009

(65) Prior Publication Data
US 2010/0327135 A1    Dec. 30, 2010

(51) Int. Cl.
*A47B 96/06*    (2006.01)
*A47G 29/00*    (2006.01)
*A47K 1/00*    (2006.01)
*E04G 3/00*    (2006.01)

(52) U.S. Cl. ........... 248/220.21; 248/220.31; 248/224.8; 211/26; 211/175

(58) Field of Classification Search ............ 211/26, 211/175; 248/220.21, 220.31, 220.42, 225.21, 248/224.8
See application file for complete search history.

(56) References Cited

U.S. PATENT DOCUMENTS

| | | | |
|---|---|---|---|
| 7,934,607 B2 * | 5/2011 | Henderson et al. | 211/26 |
| 2005/0155941 A1 * | 7/2005 | Hartman et al. | 211/26 |
| 2007/0224017 A1 * | 9/2007 | Pamer | 411/162 |
| 2008/0075558 A1 * | 3/2008 | Albach et al. | 411/427 |

* cited by examiner

Primary Examiner — Amy J Sterling

(57) ABSTRACT

An assembly for engaging a rail with support structures includes a bracket disposed at an end of the rail. The bracket is configured to rotate between at least first and second positions such that the bracket can present at least first or second different engagement features for engaging with different kinds of support structures.

16 Claims, 7 Drawing Sheets

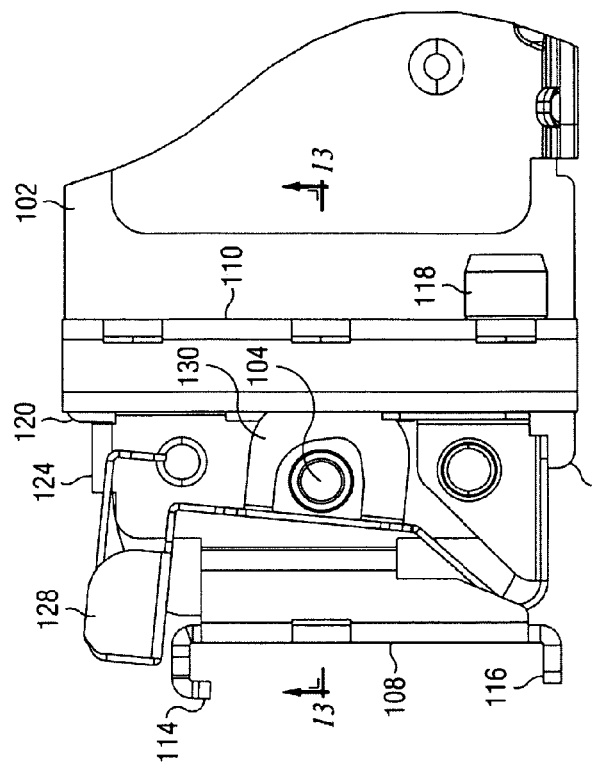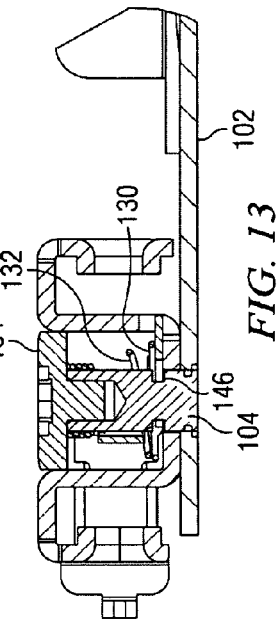
FIG. 12　　　FIG. 13
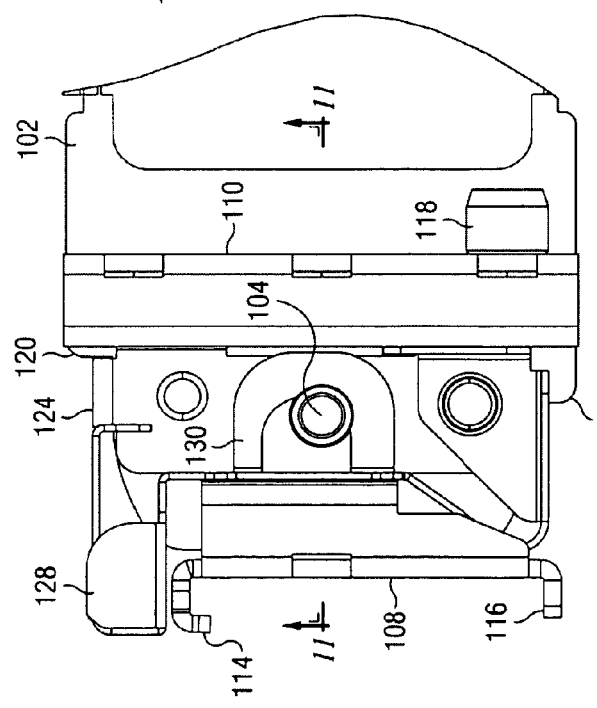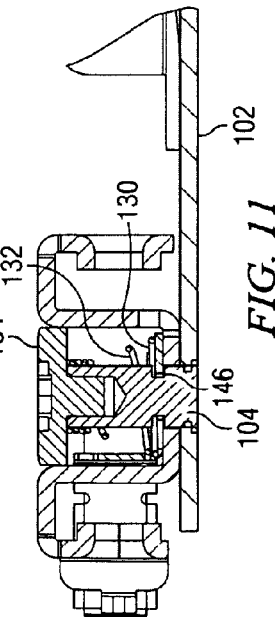
FIG. 10　　　FIG. 11

METHOD AND APPARATUS FOR ENGAGING A RAIL WITH VARIOUS SUPPORT STRUCTURES

BACKGROUND

In data centers and in other applications, it is common to mount electronic equipment such as computers and network components into racks. For example, a typical vertical rack might contain numerous server computers and/or data storage devices and power supply components. Many racks include vertical columns on which rails are mounted. The electronic equipment inside of the rack rests on these rails.

To mount the rails to the vertical columns, it is usually the case that either square holes or round holes are provided in the columns. Traditionally, rails that are designed for square hole mounting are used to engage with square-hole columns, and rails that are designed for round hole mounting are used to engage with round-hole columns.

BRIEF DESCRIPTION OF THE DRAWINGS

FIG. 10 is an orthogonal view illustrating the assembly of FIG. 1 wherein the retainer element is engaged with a recess in a post attached to the rail.

FIG. 11 is a cross section of the view in FIG. 10.

FIG. 12 is an orthogonal view similar to that of FIG. 10, wherein the retainer element is disengaged from the recess in the post.

FIG. 13 is a cross section of the view in FIG. 12.

DETAILED DESCRIPTION OF THE PREFERRED EMBODIMENTS

Figure 1:
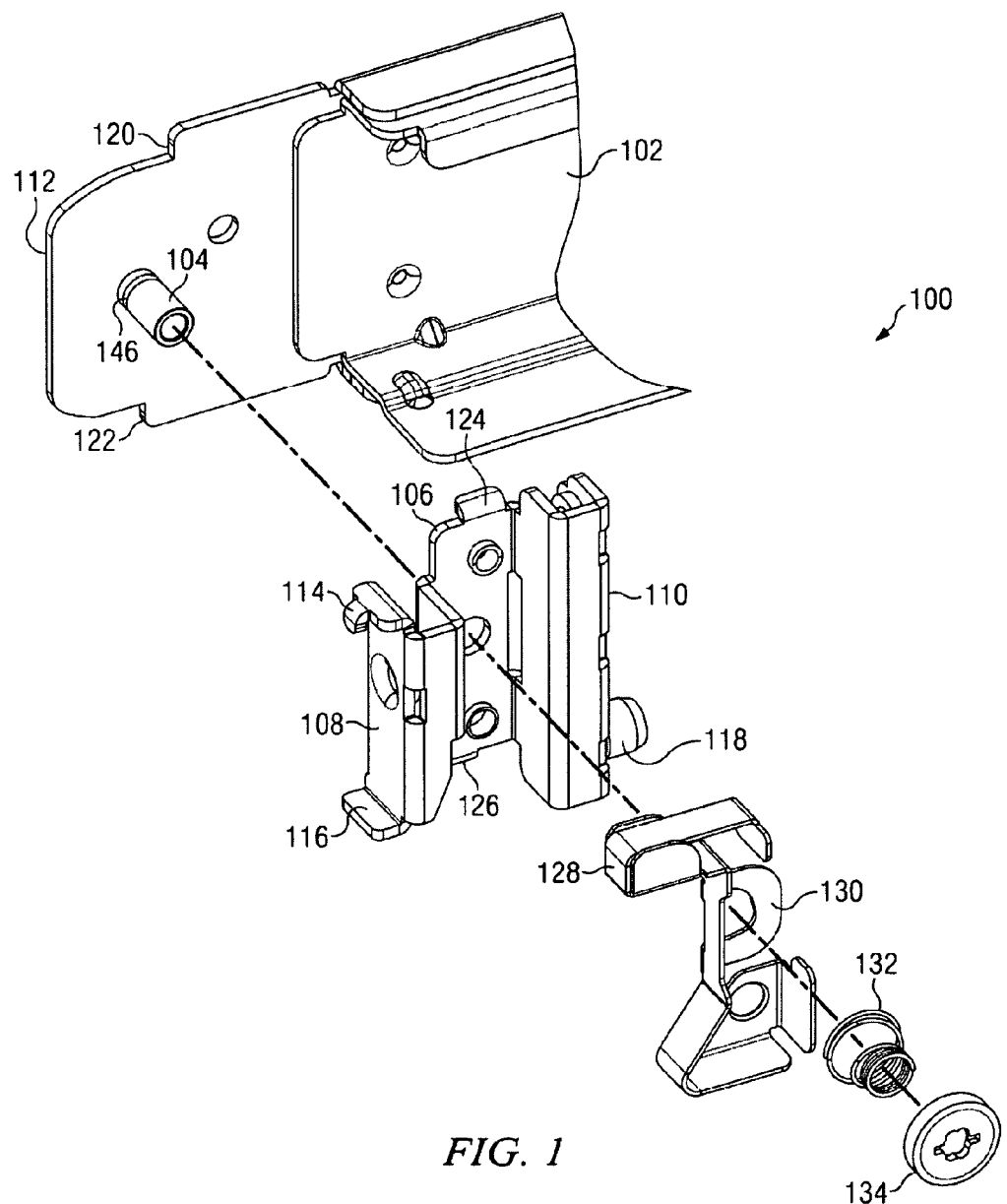
FIG. 1 is an exploded view illustrating components of an assembly according to a preferred embodiment of the invention for engaging a rail with various kinds of support structures.

FIG. 1 illustrates an assembly 100 for engaging a rail 102 with various kinds of support structures. A post 104 is attached to rail 102. Post 104 may be attached to rail 102 using any suitable attachment method such as press fitting. A bracket 106 is attached to post 104 and is configured to rotate thereon so that faces 108, 110 of bracket 106 may alternatively be disposed at end 112 of rail 102. Each of faces 108, 110 defines different engagement features 114, 116, 118 for engagement with different kinds of support structures 136, 140.

A lock feature 120, 122, 124, 126 may also be provided to lock bracket 106 in first and second positions (see FIGS. 14A and 14C) relative to rail 102. In the first position (FIG. 14A), face 110 is presented at end 112 of rail 102. In the second position, face 108 is presented at end 112 of rail 102. Lock feature 120, 122, 124, 126 will be described in more detail below in relation to FIGS. 10-16.

The engagement features defined by the faces of bracket 106 may take any variety of forms suitable for use with support structures to which it is desired to engage rail 102. In one embodiment, the engagement feature on one of the faces mates with a support structure 136 that defines one or more round holes 138, and the engagement feature on the other face may be any other kind In another embodiment, the engagement feature on one of the faces mates with a support structure 140 that defines one or more square holes 142, 144, and the engagement feature on the other face may be any other kind In yet another embodiment (as illustrated), the engagement feature on one face mates with a round-hole support structure 136, and the engagement feature on the other face mates with a square-hole support structure 140.

Figure 2:
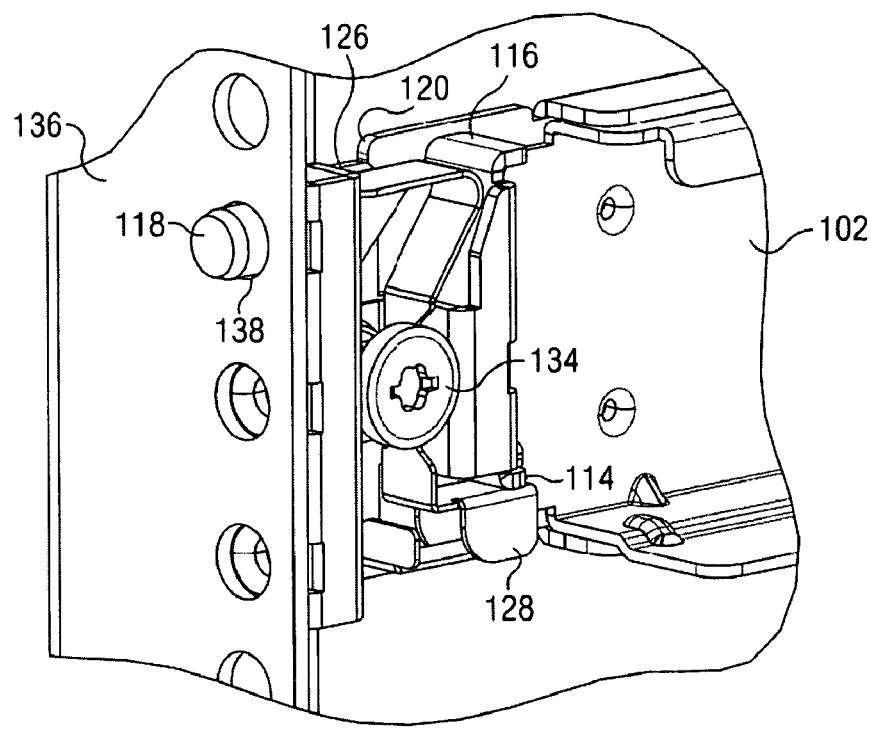
FIG. 2 is an isometric view illustrating the assembly of FIG. 1 engaged with a first kind of support structure.

The engagement feature that mates with round-hole support structure 136 may take the form, for example, of a round peg 118. Peg 118 may engage support structure 136 by extending into hole 138 as shown in FIG. 2.

Figure 3:
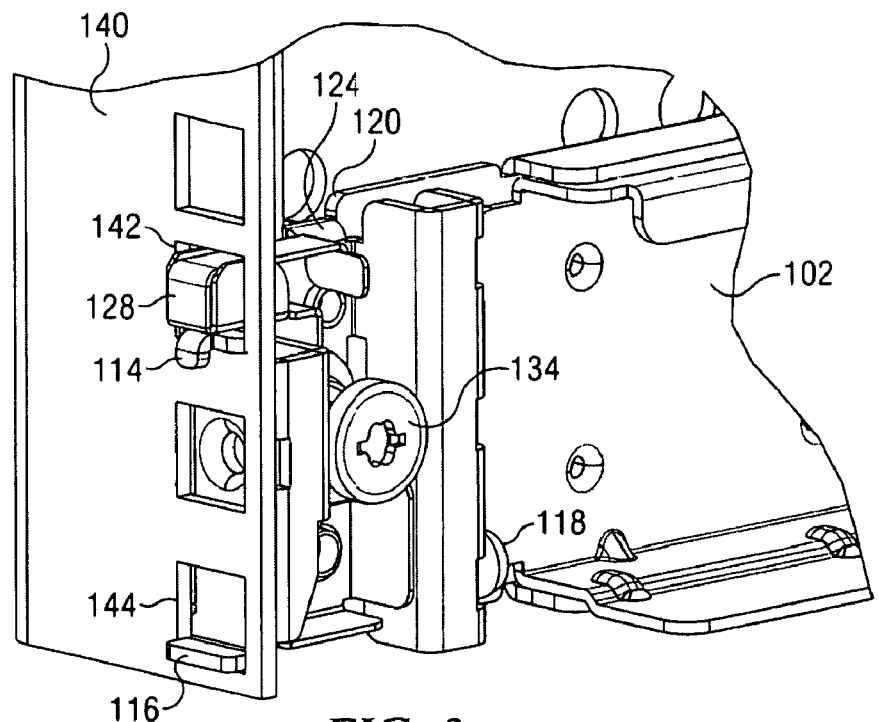
FIG. 3 is an isometric view illustrating the assembly of FIG. 1 engaged with a second kind of support structure.

The engagement feature that mates with square-hole support structure 140 may take the form, for example, of a hook 114 and a tab 116. Hook 114 may engage support structure 140 at a first hole 142, and tab 116 may engage support structure 140 at a second hole 144 below hole 142 as shown in FIG. 3.

Bracket 106 may be manufactured using any suitably rigid material, such as cold-rolled steel for example.

Figure 4:
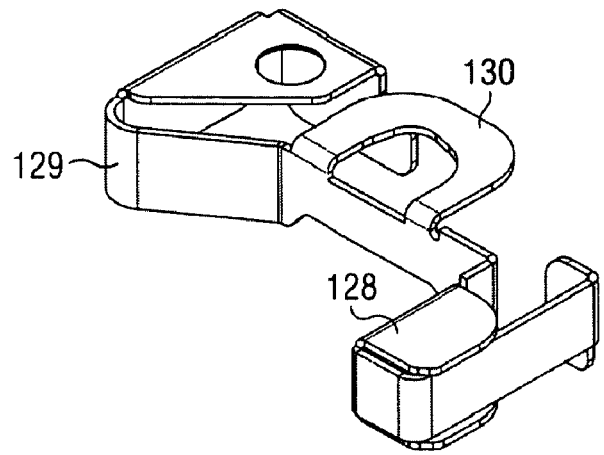
FIG. 4 is an isometric view illustrating a retainer element of the assembly of FIG. 1.
Figure 5:
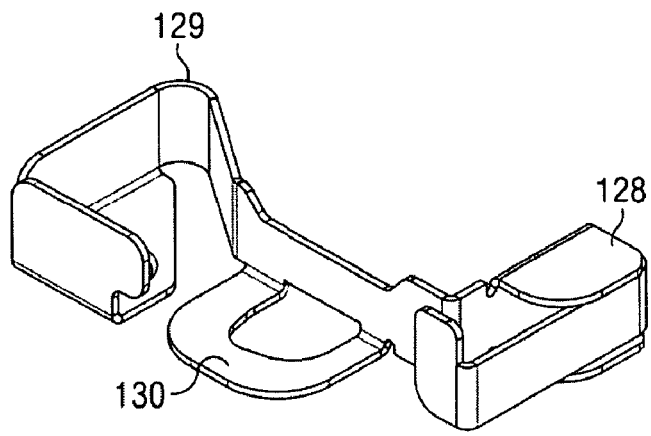
FIG. 5 is a rotated isometric view of the retainer element of FIG. 4.
Figure 6:
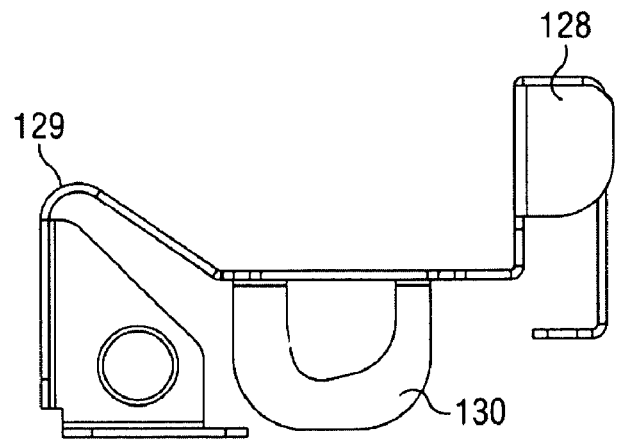
FIG. 6 is an orthogonal view of the retainer element of FIG. 4.
Figures 7, 8:
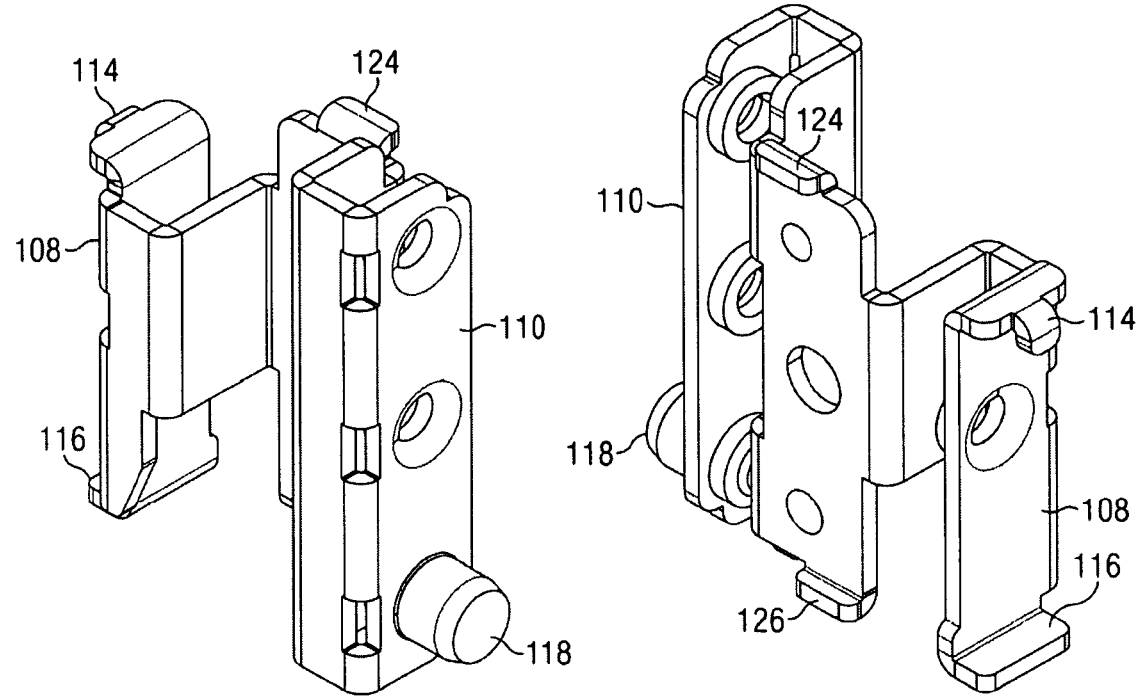
FIG. 7 is an isometric view illustrating a bracket element of the assembly of FIG. 1.
FIG. 8 is a rotated isometric view of the bracket element of FIG. 7.
Figure 9:
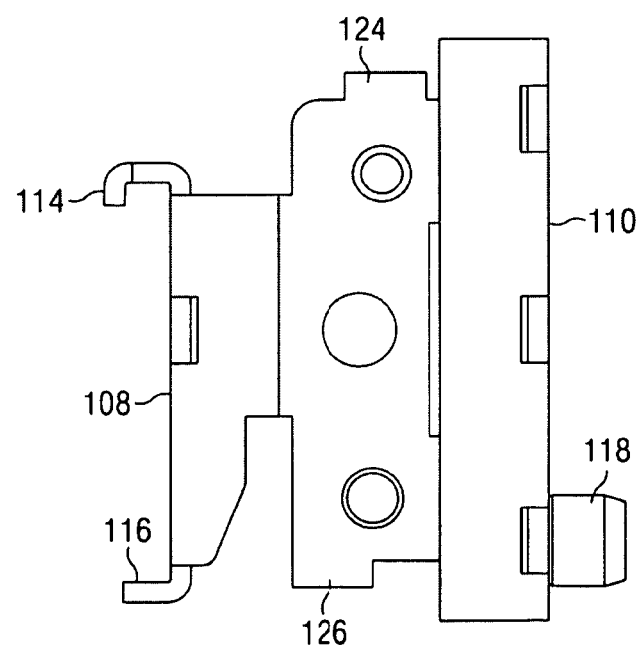
FIG. 9 is an orthogonal view of the bracket element of FIG. 7.

A retainer 128 may also be provided in assembly 100. Retainer 128 may be configured to at least partially enter support structure 140 at hole 142 above hook 114, as shown in FIG. 3. This helps to retain hook 114 in hole 142. Preferably, retainer 128 is biased toward support structure 140 when assembly 100 is in the position shown in FIG. 14C. This bias may be achieved using any suitable means. In the illustrated embodiment, the bias is achieved by manufacturing retainer 128 from a resilient material such as stainless steel and including a flex point such as flex point 129 indicated in FIGS. 4-6. Preferably, the bias provided is such that retainer 128 may be removed from hole 142 by applying a manual force on retainer 128 to overcome the bias.

Figures 14A, 14B, 14C:
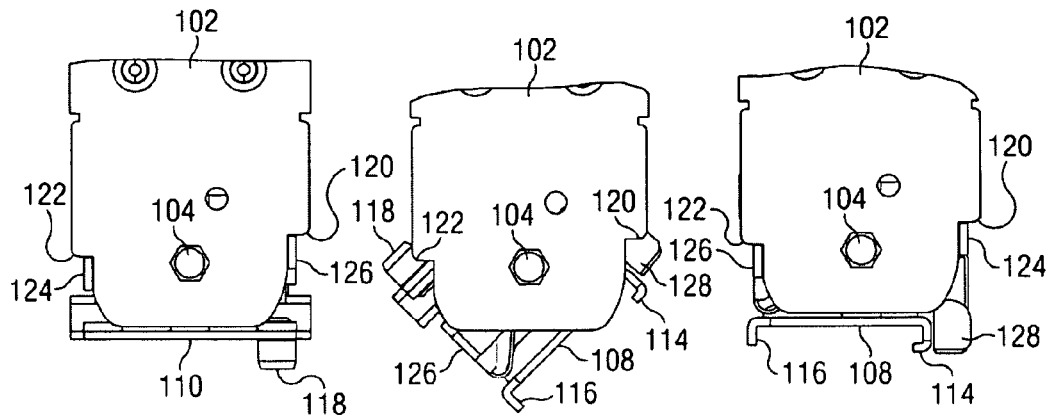
FIGS. 14A-C are orthogonal views of the assembly of FIG. 1 viewed from a back side of the rail, wherein the bracket element is shown in first, second and third rotational positions relative to the rail.
Figures 15A, 15B, 15C:
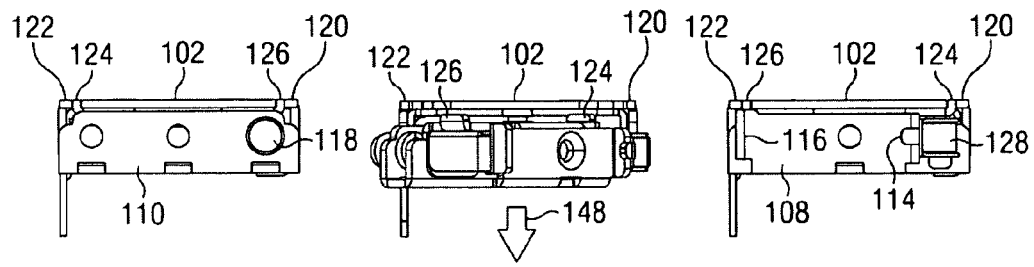
FIGS. 15A-C are orthogonal views similar to those in FIGS. 14A-C, viewed from an end of the rail.
Figures 16A, 16B, 16C:
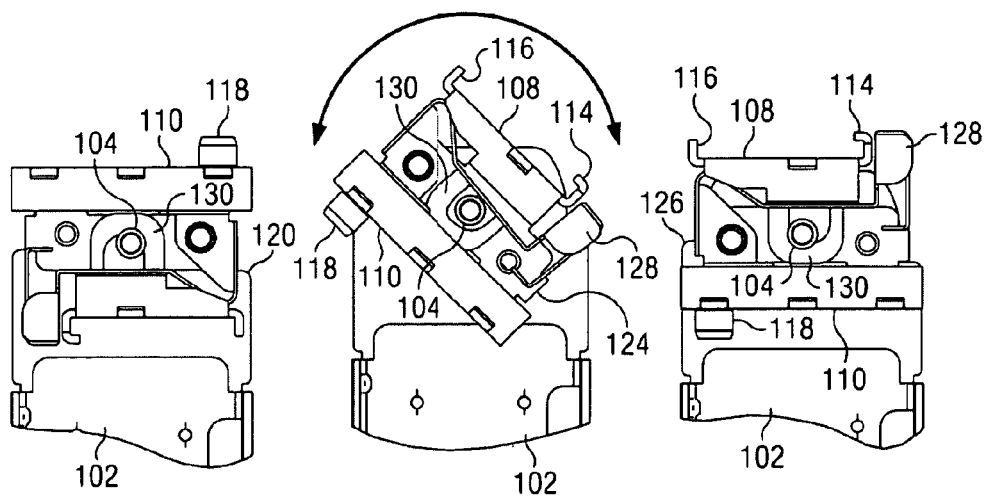
FIGS. 16A-C are orthogonal views similar to those in FIGS. 14A-C, viewed from a top side of the rail.

A variety of locking mechanisms may be used to lock bracket 106 in its first and second positions. The locking mechanism of the illustrated embodiment will now be described with reference to FIGS. 10-16. FIGS. 14A, 15A and 16A show assembly 100 locked in a first position in which face 110 is presented at end 112 of rail 102. FIGS. 14C, 15C and 16C show assembly 100 locked in a second position in which face 108 is presented at end 112 of rail 102. In the first locked position, protrusion 124 of bracket 106 engages shoulder 122 on rail 102 and protrusion 126 of bracket 106 engages shoulder 120 on rail 102, when bracket 106 rests against rail 102. In the second locked position, protrusion 126 engages shoulder 122 and protrusion 124 engages shoulder 120, when bracket 106 rests against rail 102.

FIGS. 14B, 15B and 16B show assembly 100 in an unlocked intermediate position in which it is free to rotate about post 104. To achieve this unlocked position, bracket 106 is moved away from rail 102 along post 104 in the direction 148 indicated in FIG. 15B. In this position, protrusions 124, 126 are able to clear shoulders 120, 122 of rail 102, thus enabling bracket 106 to rotate clockwise or counterclockwise around post 104, as indicated in FIG. 16B.

Bracket 106 may be biased toward rail 102. Any suitable biasing mechanism may be employed for this purpose. In the embodiment illustrated, the bias is achieved with a spring 132 that is mounted between a surface 130 of retainer 128 and the underside of the head of a screw 134. Retainer 128 is mounted over post 104 above bracket 106, and screw 134 screws into post 104 to hold assembly 100 against rail 102. Preferably, the bias is such that it can be overcome by applying a manual force to assembly 100 in direction 148 to pull assembly 100 away from rail 102 in opposition to spring 132.

Further locking robustness can be achieved by providing a recess 146 in post 104 to receive surface 130 of retainer 128. Recess 104 is positioned along post 104 so that surface 130 enters recess 104 when bracket 106 rests against rail 102 as shown in FIGS. 10-13. In this position, entry of surface 130 into recess 146 occurs by virtue of the resilient bias of retainer 128 toward the position shown in FIG. 10-11. Once surface 130 has engaged recess 146 as shown in FIGS. 10-11, bracket 106 cannot be pulled away from rail 102 to enable rotation. To enable rotation, retainer 128 must first be moved as shown in FIGS. 12-13 to disengage surface 130 from recess 146 so that bracket 106 may be pulled away from rail 102 in opposition to spring 132. Once bracket 106 has been pulled a sufficient distance away from rail 102 that protrusions 124, 126 clear shoulders 120, 122, assembly 100 may be rotated.

Although the embodiment illustrated presents only two different faces 108, 110 for engagement with two different types of support structures, alternative embodiments may provide additional faces for engagement with additional different types of support structures. For example, embodiments may be created with three or four different faces, each presenting different engagement features. An alternative locking feature may be provided to accommodate the additional positions of bracket 106 in such an embodiment.

The support structures to which rail 102 is to be mounted may take a variety of forms and may be located in a variety of environments. In one common class of applications, it is anticipated that the support structures will constitute vertical columns located at the corners of a rack. For example, the support structures may be the corners of a rack within which electronic components such as computer equipment components are housed.

Figure 17:
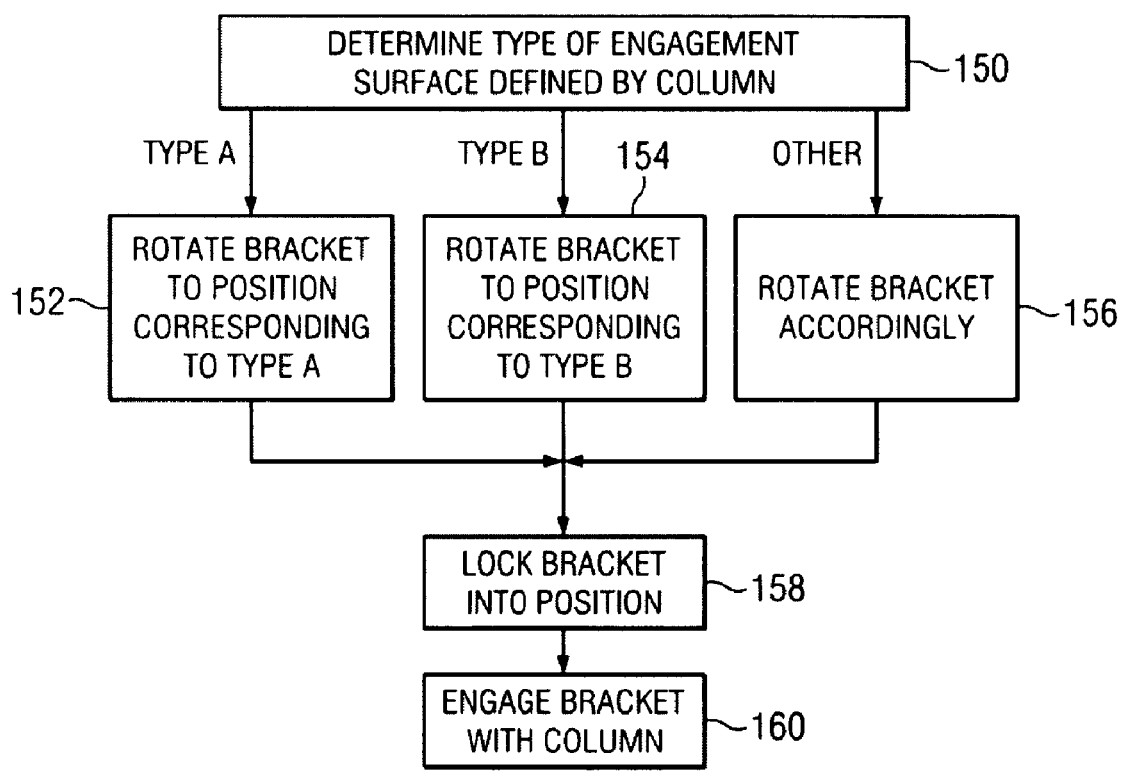
FIG. 17 is a flow diagram generally illustrating a method for using the assembly of FIG. 1 according to a preferred embodiment of the invention.

FIG. 17 is a flow diagram illustrating a method for using assembly 100 in such an environment to install rail 102 into the rack. In step 150, a determination is made whether a column of the rack defines first or second different types of engagement surfaces. (For example, a determination is made whether the column defines round holes or square holes.) If the column defines the first type, then bracket 106 may be rotated in step 152 such that a first engagement feature is presented at end 112 of rail 102. The first engagement feature would be the one that mates with the first type of engagement surface. But if the column defines the second type, then bracket 106 may be rotated in step 154 such that a second engagement feature is presented at end 112 of rail 102. The second engagement feature would be the one that mates with the second type of engagement surface. In embodiments in which assembly 100 defines more than two types of engagement features, and if the column defines a third type of engagement surface compatible with one of those features, then the bracket may be rotated accordingly as indicated at 156. Finally, bracket 106 may be locked into the appropriate position in step 158, and engaged with the column in step 160. These steps may be repeated for embodiments in which two assemblies 100 are provided, one on each of the two ends of rail 102.

While the invention has been described in detail with reference to preferred embodiments thereof, the described embodiments have been presented by way of example and not by way of limitation. It will be understood by those skilled in the art and having reference to this specification that various changes may be made in the form and details of the described embodiments without deviating from the spirit and scope of the invention as defined by the appended claims.

What is claimed is:

1. An assembly for engaging a rail with support structures, comprising:
   a post attached to the rail;
   a bracket attached to the post and configured to rotate thereon such that at least first and second faces of the bracket may alternatively be disposed at an end of the rail, the first and second faces respectively defining first and second different engagement features corresponding to first and second different support structures, wherein the first engagement feature comprises a round peg; and
   a lock feature configured to lock the bracket in at least first and second positions relative to the rail, the first position presenting the first face at the end of the rail, and the second position presenting the second face at the end of the rail, the lock feature includes:
   first and second shoulders disposed at top and bottom sides of the end of the rail; and
   first and second protrusions on the bracket configured to engage the first and second shoulders when the assembly is in either of the first and second positions and the bracket rests against the rail.

2. The assembly of claim 1, wherein:
   the first engagement feature mates with a support structure having a round hole therein.

3. The assembly of claim 2, wherein:
   the second engagement feature mates with a support structure having a square hole therein.

4. The assembly of claim 1, wherein:
   the first engagement feature mates with a support structure having a square hole therein.

5. The assembly of claim 4, wherein:
   the second engagement feature mates with a support structure having a round hole therein.

6. The assembly of claim 4, wherein:
   the first engagement feature comprises a hook for engaging the support structure at a first hole and a tab for engaging the support structure at a second hole below the first.

7. The assembly of claim 6, further comprising:
   a retainer configured to at least partially enter the support structure at the first hole above the hook, the retainer resiliently biased toward the support structure when the assembly is in the first position, and the retainer capable of being removed from the first hole by manually applying a force on the retainer to overcome the bias.

8. The assembly of claim 1:
   further comprising a spring biasing the bracket toward the rail; and wherein the protrusions clear the shoulders when the bias is overcome by a manual force.

9. The assembly of claim 8, wherein:
the retainer comprises a surface configured to engage a recess in the post when the bracket rests against the rail, such that the retainer must be moved to disengage the surface from the recess before the bracket can be pulled away from the rail in opposition to the spring.

10. The assembly of claim 1, wherein the first and second different engagement features are configured to mate with a round hole of a first support structure and a square hole of a second support structure, respectively.

11. The assembly of claim 2 further comprising the support structure with the round hole.

12. The assembly of claim 4 further comprising the support structure with the square hole.

13. The assembly of claim 1, wherein the bracket is configured to mate with either a first support structure having a round hole or a second support structure having a square hole.

14. An assembly for engaging a rail with support structures, comprising:
a post attached to the rail;
a bracket attached to the post and configured to rotate thereon such that at least first and second faces of the bracket may alternatively be disposed at an end of the rail, the first and second faces respectively defining first and second different engagement features corresponding to first and second different support structures, wherein:
the first engagement feature comprises a round peg; and
a lock feature configured to lock the bracket in at least first and second positions relative to the rail, the first position presenting the first face at the end of the rail, and the second position presenting the second face at the end of the rail, wherein the lock feature comprises:
first and second shoulders disposed at top and bottom sides of the end of the rail; and
first and second protrusions on the bracket configured to engage the first and second shoulders when the assembly is in either of the first and second positions and the bracket rests against the rail.

15. The assembly of claim 14:
further comprising a spring biasing the bracket toward the rail; and
wherein the protrusions clear the shoulders when the bias is overcome by a manual force.

16. The assembly of claim 15, wherein:
the retainer comprises a surface configured to engage a recess in the post when the bracket rests against the rail, such that the retainer must be moved to disengage the surface from the recess before the bracket can be pulled away from the rail in opposition to the spring.

* * * * *